COMMON HOUSING FOR INDEPENDENT SEMICONDUCTOR DEVICES

Filed Dec. 6, 1967 2 Sheets-Sheet 1

INVENTOR.
FRANK W. PARRISH
BY
OSTROLENK, FABER, GERB & SOFFEN
ATTORNEYS

COMMON HOUSING FOR INDEPENDENT SEMICONDUCTOR DEVICES

Filed Dec. 6, 1967 2 Sheets-Sheet 2

INVENTOR.
FRANK W. PARRISH

BY

OSTROLENK, FABER, GERB & SOFFEN
ATTORNEYS

United States Patent Office 3,483,444

Patented Dec. 9, 1969

3,483,444

COMMON HOUSING FOR INDEPENDENT SEMICONDUCTOR DEVICES

Frank W. Parrish, El Segundo, Calif., assignor to International Rectifier Corporation, El Segundo, Calif., a corporation of California Filed Dec. 6, 1967, Ser. No. 688,491
Int. Cl. H01l 3/00, 5/00
U.S. Cl. 317—234 3 Claims

ABSTRACT OF THE DISCLOSURE

Two independent wafers of semiconductor material are mounted within a common hermetically sealed housing and have their electrodes connected to one another within the housing. At least one of the devices is a controllable device having its control lead extending through the common housing.

This invention relates to a semiconductor housing structure, and more particularly relates to a semiconductor housing structure for receiving two separate mechanically parallel disposed wafers which are interconnected within the housing to form a circuit module. The parallel connection of independent semiconductor devices of similar or diverse types is well-known for the creation of various circuit configurations.

In accordance with the present invention, independent wafers, such as one diode and one controlled rectifier, are disposed within a common housing with at least one of the wafers being seated directly atop the conduction-receiving stud of the housing. The electrodes of the two separate devices are then interconected to form some predetermined structure, such as a reverse-poled diode and controlled rectifier or two reverse-poled controlled rectifiers which define an A-C switch. The term "reverse-poled" is sometimes referred to as "anti-parallel" or "inverse-parallel" and shall be referred to as "reverse-poled" in this application. Alternatively, the devices could be rectifying wafers arranged to form a portion of a bridge circuit or the like. Where two controlled rectifiers or devices having control leads extending from one surface of the wafer are used, and in order to use devices having the same layer sequence, such as PNPN sequences, one device is connected directly to the housing base while the other has its surface adjacent the housing base insulated therefrom, with an interconnection being made within the device such that the devices are reversely poled, while their control leads extend upwardly and in the same direction so that these leads can be conveniently brought through the common device housing. Alternatively, opposite sequence layer devices could be used with both having their lower surface directly secured to the conductive housing base.

Accordingly, a primary object of this invention is to provide a single housing device which contains at least two separate semiconductor wafers, one of which has a control lead.

Another object of this invention is to provide an inexpensive combination of independent semiconductor devices which are contained in a common housing.

A further object of this invention is to provide a novel unitary housing for semiconductor devices which contains sub-assemblies of circuits which are connected therein and which use the conductive base of the housing as a major common heat sink.

These and other objects of this invention will become apparent from the following description when taken in connection with the drawings, in which.

Figure 1:
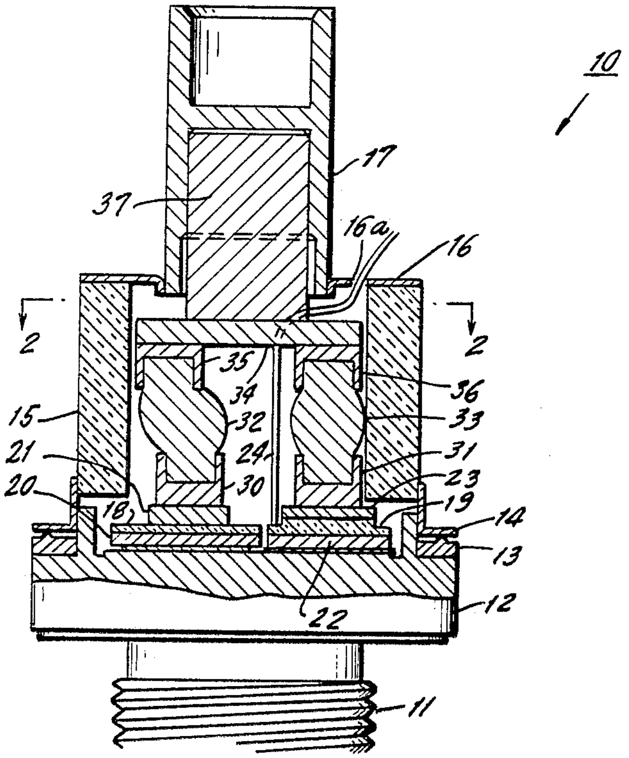
FIGURE 1 is a cross-sectional view of a first embodiment of the invention in which a rectifying semiconductor wafer and controlled rectifier semiconductor wafer are contained in a common housing and are interconnected with one another within the housing.
Figure 2:
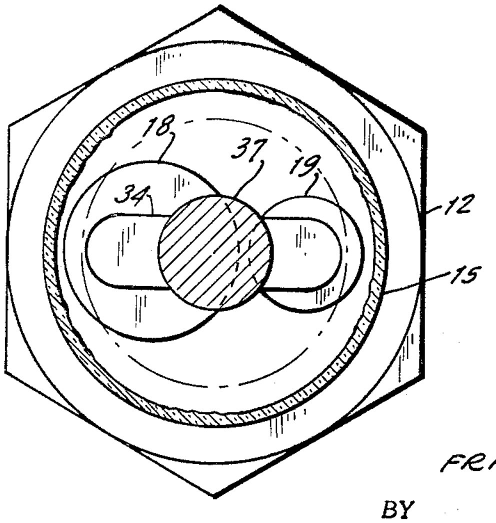
FIGURE 2 is a cross-sectional view of FIGURE 1 taken across the section line 2—2 in FIGURE 1.
Figure 3:
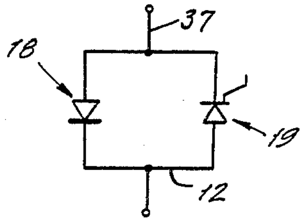
FIGURE 3 is a circuit diagram of the configuration of the device of FIGURES 1 and 2.

Referring first to FIGURES 1, 2 and 3, there is illustrated a main housing structure which is of a generally standard type for the housing of a single semiconductor wafer. Thus, in FIGURES 1 and 2, there is provided a main conductive support stud 10, having a threaded post 11, and a conductive base 12 which may be hexagonal in shape, as shown in FIGURE 2. A welding ring 13 is provided around the outer periphery of conductive base 12 and receives a metallic flange 14 which is secured to the lower end of the insulation cylinder 15. The upper end of cylinder 15 is then connected to a suitable metallic ring 16 which is, in turn, connected to a suitable lead-receiving connector 17 of the standard type. This arrangement then defines a hermetically sealed housing for devices which are contained within the interior of the housing.

In accordance with the invention, two separate semiconductor wafers 18 and 19 are contained within the housing and, in the usual manner, are supported between suitable molybdenum expansion plates 20–21 and 22–23, respectively. The expansion plates 20 and 22 are soldered directly to the base 12 of stud 10 so that heat can be efficiently removed from these devices. Device 18 may contain a single junction therein to define a rectifier device, while device 19 may be a controlled rectifier device having four layers and having a gate lead 24 extending therefrom.

In FIGURE 1 and as schematically shown in FIGURE 3, molybdenum plate 22 of controlled rectifier 19 is the anode electrode of the device, while molybdenum plate 20 is connected to the cathode of rectifier device 18. Thus, devices 18 and 19 are reversely poled. The upper expansion plates 21 and 23 are brazed prior to assembly of the devices, to conductive cups 30 and 31 which receive the lower ends of pigtail leads 32 and 33, respectively. A conductive plate 34, having cups 35 and 36 at its opposite ends, is then secured to a conductive cylinder 37 which is rigidly connected to member 17. The upper ends of leads 32 and 33 are then received in cups 35 and 36, respectively, as shown in FIGURE 1, thereby connecting the anode of device 18 to the cathode of device 19 and forming the connection shown in FIGURE 3.

In assembling the device of FIGURE 1, components 37, 34, 35, 36, 32, 33, 30 and 31 can be initially sub-assembled and brazed to the expansion plates 21 and 23 of the two devices 18 and 19. This subassembly is then placed atop stud 12 and expansion plates 20 and 22 are brazed to stud 12. Thereafter, a second subassembly, formed of welding flange 14, insulation cylinder 15, cup 16 and member 17 are telescoped over this subassembly, with lead 24 being taken through the opening 16*a* in cup 16. Flange 14 is then welded to welding ring 13 to complete the assembly of the unitary device. If desired, this welding operation can take place in an inert atmosphere so that the interior of the housing is filled with the inert gas, it being understood that opening 16*a* is hermetically sealed about lead 24. Alternatively, the device can be potted with a suitable potting compound through openings in cup 16 (not shown).

The completed device shown in FIGURE 3 will have many obvious circuit applications, previously obtained only by the use of two independent and separately housed devices 18 and 19. Obviously, the use of only a single, though somewhat larger housing, as shown in FIGURES 1 and 2, will provide substantial economy over the construction of this type circuit with both devices being mounted on the common and large heat sink 12.

Figure 4:
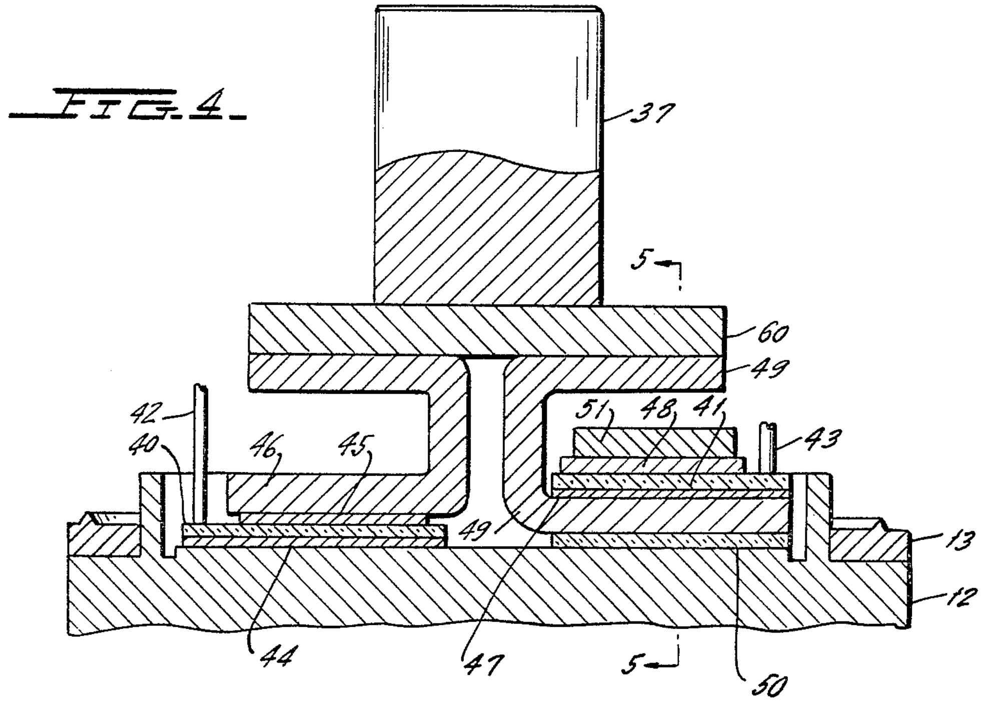
FIGURE 4 is a partial cross-sectional view of the housing of FIGURE 1 having a modified connection structure for connecting reversely-poled semiconductor wafers within the housing.
Figure 5:
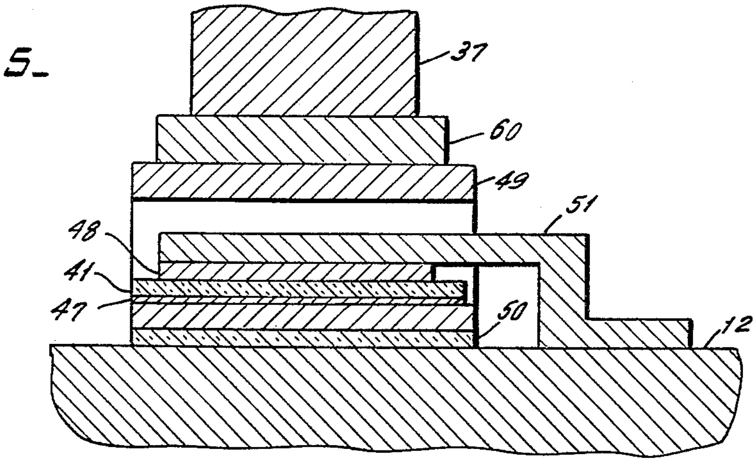
FIGURE 5 is a cross-sectional view of FIGURE 4 taken across the section line 5—5 in FIGURE 4.
Figure 6:
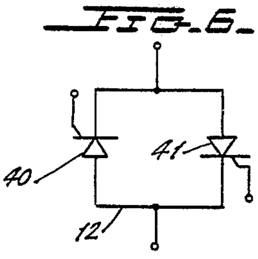
FIGURE 6 is a circuit diagram of the configuration shown in FIGURES 4 and 5.

FIGURES 4 and 5 illustrate portions of the housing of FIGURES 1 and 2, as modified by a different terminal connection structure and with one of the devices being electrically insulated from stud 12. In the device of FIGURES 4 and 5, there are shown two semiconductor wafers 40 and 41, which are each controlled rectifiers, each having a PNPN sequence of conductivity layers and which are to be connected in oppositely poled relation, as shown in FIGURE 6. Since these devices have the same sequence of layers, their respective gate leads 42 and 43 will extend from the same surface adjacent their cathode surface and opposite their anode surface using standard configurations for the semiconductor wafers. Therefore, if water 41 were to be directly connected to stud 12 and oppositely poled with respect to device 40, the gate lead 43 would face stud 12.

In accordance with an important feature of the present invention and in order to contain these two devices in a common housing, a novel terminal configuration is used to interconnect the two devices. Thus, the device 40, which has an anode expansion plate 44 and cathode expansion plate 45, has the anode expansion plate 44 connected directly to stud 12. The anode expansion plate 45 is then connected to a U-shaped flexible conductor 46 and the gate lead 42 extends upwardly, as illustrated, so that it may be conveniently taken through some suitable opening in the housing, as shown in FIGURE 1 for lead 24. Wafer 41 is similarly connected between an anode expansion plate 47 and cathode expansion plate 48 where the anode expansion plate 41 is connected directly to the interior of the lower lug of U-shaped conductor 49. The opposite surface of this U-shaped conductor is then connected to heat sink 12, but through a beryllium oxide slab 50 which electrically insulates conductor 49 from stud 12, but permits thermal conduction from conductor 49 to stud 12. The upper expansion plate 48 is then connected to a connecting strap 51 which, as shown in FIGURE 5, connects the cathode of wafer 40 directly to the surface of stud 12. The upper end of U-shaped strap 49 and the upper end of strap 46 are then connected to a common plate 60 which is equivalent to plate 34 in FIGURE 1, and is brazed to conductive member 37.

This novel arrangement for interconnecting the terminals of controlled rectifiers 40 and 41 permits their gate leads 42 and 43 to extend in the same direction so that they can be conveniently taken through the main housing body. Moreover, the arrangement permits the thermal connection of the two devices directly to the main stud body 12, with the two devices being oppositely poled to define an A-C switch configuration.

In assembling the device of FIGURES 4 and 5 in a housing of the type of FIGURE 1, it will be apparent that a subassembly is first formed of the U-shaped conductors 46 and 49 with the wafers 40 and 41, the connecting strap 59 and conductive members 60 and 37. The subassembly is then placed atop stud 12, with beryllium oxide plate 50 interposed between strap 46 and stud 12 and expansion plate 44, beryllium oxide plate 50 and strap 51 being brazed to stud 12. Thereafter, the housing subassembly is slid over this group of components fixed to stud 12 and the housing is completed.

Although this invention has been described with respect to it preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. In combination; a hermetically sealed housing and first and second semiconductor devices connected therein; said housing comprising a main conductive plate having a cylindrical enclosure secured thereto; said first and second semiconductor devices comprising monocrystalline wafers of silicon each having at least one P-N junction therein; each of said first and second devices having surfaces, respectively; said first device having a control electrode extending from the upper surface thereof; the bottom surfaces of each of said first and second devices mechanically and thermally connected to the upper surface of said main conductive plate and within said cylindrical enclosure; means electrically connecting said first terminal plates of said first and second devices together comprising an elongated conductive member connected to said respective first terminal plates at its opposite ends; and a flexible conductor connected to a central portion of said elongated conductive member; said flexible conductor extending through said cylindrical enclosure; said control electrode extending through said cylindrical enclosure.

2. The device as set forth in claim 1 wherein each of said first and second devices are controlled rectifiers; said second device having a control lead extending from the upper surface thereof and in the same direction as said control lead of said first device.

3. The device as set forth in claim 2 which includes a heat conductive, electrically insulating wafer interposed between the bottom surface of said second device and the upper surface of said main conductive plate; and first connector means connecting the upper surface of said second device to said main conductive plate; and second conductive means connecting the bottom surface of said second device to said one end of said elongated conductive member.

References Cited

UNITED STATES PATENTS

| | | | |
|---|---|---|---|
| 3,193,707 | 7/1965 | Yanai | 307—88.5 |
| 3,210,618 | 10/1965 | Rosenberg et al. | 317—234 |
| 3,418,587 | 12/1968 | Riebman et al. | 317—234 X |

JAMES D. KALLAM, Primary Examiner

R. F. POLISSACK, Assistant Examiner

U.S. Cl. X.R.

317—235